United States Patent [19]

Van der Spiegel et al.

[11] Patent Number: 5,254,504
[45] Date of Patent: Oct. 19, 1993

[54] METHOD OF MANUFACTURING FERROELECTRIC MOSFET SENSORS

[75] Inventors: Jan Van der Spiegel, Philadelphia, Pa.; Antinino Fiorillo, Piza, Italy

[73] Assignee: Trustees of the University of Pennsylvania, Philadelphia, Pa.

[21] Appl. No.: 755,123

[22] Filed: Sep. 5, 1991

Related U.S. Application Data

[62] Division of Ser. No. 337,665, Apr. 13, 1989.

[51] Int. Cl.$^5$ .................... H01L 21/469; B05D 5/12
[52] U.S. Cl. .................... 437/231; 437/901; 427/100
[58] Field of Search ............ 437/901, 231; 427/100

[56] References Cited

U.S. PATENT DOCUMENTS

| | | | |
|---|---|---|---|
| 4,520,413 | 5/1985 | Piotrowski et al. | 365/157 |
| 4,820,586 | 4/1989 | Krueger et al. | 427/100 |
| 4,830,795 | 5/1989 | Scheinbeim et al. | 269/22 |

FOREIGN PATENT DOCUMENTS 0249025 10/1988 Japan ...................... 357/26

Primary Examiner—Olik Chaudhuri
Assistant Examiner—Ourmazd S. Ojan
Attorney, Agent, or Firm—Woodcock Washburn Kurtz Mackiewicz & Norris

[57] ABSTRACT

A method of manufacturing ferroelectric sensors having piezoelectric and pyroelectric properties are provided. These sensors include a semiconductor transistor having a gate and a surface layered with an integral film comprising a substantially poled ferroelectric polymer. The integral film is electrically connected to ground or a voltage source and to the gate of the semiconductor transistor. The preferred integral film is deposited on the semiconductor transistor using spin coating techniques. Extremely sensitive acoustic imaging sensors and the like can be produced in accordance with the invention which have high voltage sensitivity and better acoustic impedance match with body tissues and water.

15 Claims, 1 Drawing Sheet

METHOD OF MANUFACTURING FERROELECTRIC MOSFET SENSORS

This is a division of application Ser. No. 07/337,665, filed Apr. 13, 1989.

FIELD OF THE INVENTION

This invention relates generally to ferroelectric sensors having piezoelectric and pyroelectric properties, especially those used for ultrasound imaging, as well as tactile, heat and IR sensing.

BACKGROUND OF THE INVENTION

Until recently, lead titanate (PZT) compounds were a favorite for use as piezoelectric materials in acoustic imaging transducers and similar devices requiring a high voltage sensitivity and electro-mechanical coupling coefficient, as well as low acoustic impedance and an ability to be formed-into arbitrary shapes. While proponents of PZT have touted its high sensitivity and relatively low cost, it has been discovered that the use of PZT compounds in connection with medical systems is inherently non-optimal because of the large acoustic impedance mismatch between the ceramic transducer and the mostly liquid body constituents. As a consequence of the mismatch in acoustic impedance, sensitivity bandwidth and acoustic wave acceptance angle can be sacrificed.

One alternative to the use of PZT compounds that has offered some solutions to this problem is the choice of the piezoelectric polymer, polyvinylidene fluoride ($PVF_2$ or PVDF), as described by Swartz and Plummer in "Integrated Silicon-$PVF_2$ Acoustic Transducers Arrays," IEEE Trans. Sonics Ultra Son., su-27, vol. ed-26, No. 12, pp. 1921-1931 (December, 1979), which is hereby incorporated by reference. This plastic material has a relatively low acoustic impedance which approximates that of water. Thus, PVF2 cuts down on the impedance mismatch associated with PZT compounds. The natural consequence of this improvement is increased bandwidth, sensitivity and acceptance angle, without the need of front matching layers.

In order for $PVF_2$ films to be used as ferroelectric materials, they generally must be stretched mechanically as well as oriented electrically (poled) to convert the non-polar crystalline phase into a polar crystalline phase. Thus, prior artisans have used preformed films which were then epoxy glued to MOSFET transistor chips to produce an electric acoustic sensor. Swartz and Plummer describe such sensors in the above-mentioned article at pages 1921-22. This technique, however, was fraught with manufacturing and performance disabilities. It is understood that gluing preformed films onto transistor chips in small arrays is awkward. Additionally, the epoxy glue often presents a loss of sensitivity due to impedance mismatch and discontinuities in the glue layer.

Accordingly, there exists a need for a better manufacturing technique for preparing integrated silicon-polymer film ferroelectric arrays. There is also a need to produce low cost piezoelectric and pyroelectric sensors having better acoustic imaging of body tissues with higher voltage sensitivity and low impedance.

SUMMARY OF THE INVENTION

This invention provides novel ferroelectric sensors and methods for their fabrication. The ferroelectric sensors include semiconductor transistor means having a gate and a first surface layered with an integral film of a substantially poled ferroelectric polymer. The integral film is electrically connected to ground or an applied voltage source and to the gate of the semiconductor transistor means.

In the novel method of this invention, a semiconductor transistor means having a first surface thereon is provided. This surface is then spin coated with a solution comprising a polymer capable of ferroelectric properties and a solvent. Substantially all of the solvent is then removed to provide a polymer film coated surface prior to poling at least a portion of the polymer film. Finally, the sensor is provided with electrode means for establishing electrical contact between the polymer film and a ground or a voltage source.

The sensor can include a specially designed copolymer film including P(VDF-TrFE) for enhancing both piezoelectric and pyroelectric activity. Additional heating steps can be included for improving the crystallinity of the polymer or copolymer. The integral polymer film can be provided with a deposited layer of metal for providing electrical connection to the ground or voltage source. Plasma etching and specific poling techniques are also provided for enhancing the operability of the disclosed devices.

Accordingly, integrated silicon-polymer film ferroelectric arrays can be manufactured at low cost using batch processing. These arrays can provide better acoustic imaging of body tissues with higher sensitivity and lower acoustic impedance. The transducer arrays of this invention employ extremely thin films of thermoelectric polymers which are preferably deposited directly from solution onto doped silicon transistors and etched in any required pattern as desired. By eliminating epoxy adhesive layers used in the prior art, and by reducing the thickness of the polymer film, the capacitance and film uniformity improve as well as the resonance frequency and resolution and voltage signal of the ferroelectric film.

It is therefore an object of this invention to provide piezoelectric and pyroelectric sensors which include one or more polymer films in connection with a front-end MOSFET transistor It is another object of this invention to provide methods for batch manufacturing acoustic transistors which have greater available voltage signals and improved signal to noise ratio for providing better acoustic impedance match to body tissues and water, as well as increased sensitivity and functionality in medical applications.

BRIEF DESCRIPTION OF THE DRAWINGS

The accompanying drawings illustrate preferred embodiments for the disclosed invention, in which.

DETAILED DESCRIPTION OF THE INVENTION

Figure 1:
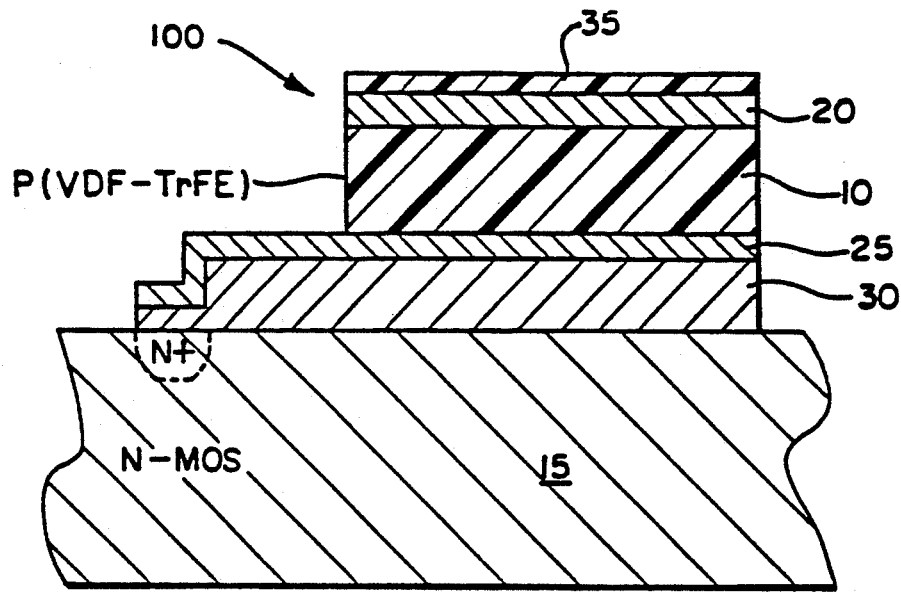
FIG. 1: is a cross-sectional schematic view of a preferred sensor structure of this invention.

The preferred operable embodiments of this invention will now be described. In a first embodiment, a ferroelectric sensor is provided comprising semiconductor transistor means having a gate and a first surface layered with an integral film of a substantially poled ferroelectric polymer. The integral film, preferably includes a thickness of less than about 10 μm and is electrically connected to ground or a voltage source and to the gate of the semiconductor transistor means. The transistor means can further include additional chip circuitry to provide further increases in the signal to noise ratio, amplification, filtering, multiplexing, etc. As used herein, the term "integral" means that the polymer film is deposited directly onto the transistor means without an epoxy or adhesive interlayer. Furthermore, the electrical connections between the integral film and the ground, voltage supply and gate can be accomplished by direct or capacitive coupling whereby the transistor means can include a thin conductive or insulating layer between the gate and the integral film.

In the preferred method of manufacturing the ferroelectric sensors of this invention, a semiconductor transistor means including a first surface is provided. A solution including a polymer and solvent is then spin coated on to the first surface to provide a solution coated surface. Substantially all of the solvent is then removed to provide a polymer film coated surface. At least a portion of the polymer film is then poled, and then electrode means are provided for establishing electrical contact, direct or capacitive, between the polymer film and ground or voltage source. The electrode means can be etched in any required pattern to increase the sensor performance or functionality.

A more detailed understanding of the preferred elements of these embodiments will now be described. The preferred ferroelectric polymer of this invention, the copolymer poly(vinylidene fluoride-trifluorethylene) "P(VDF-TrFE)", has advantages over the inorganic ceramic piezoelectric, lead zirconate titinate PZT, for acoustic imaging transducers of body tissues. P(VDF-TrFE) has a high voltage sensitivity and electromechanical coupling coefficient as well as low acoustic impedance and an ability to be formed into arbitrary shapes. For a mole ratio of 60-85 PVDF and 40-15 PTrFE, films of P(VDF-TrFE) can be prepared with a thickness electromechanical coupling coefficient of $k_t \approx 30\%$, a voltage stress coefficient of $g_t \approx 0.30$ $V \cdot m^{-1} \cdot Pa^{-1}$, and an acoustic impedance of $Z_a = 4.5$ MRayl (1 MRayl = $10^6 kg \cdot m^{-2} \cdot s^{-1}$). In comparison, $Z_a(PZT) = 20$ MRayl, $k_t(PZT) = 50\%$, and $Z_a(H_2O) = 1.5$ MRayl. Thus, the described polymeric transducers of this invention have a better acoustic impedance match to body tissues and water, the major body constituent. The consequences of the improved impedance matching are increased sensitivity, bandwidth, and acceptance angle.

Based on these considerations, a P(VDF-TrFE) ferroelectric sensor has been designed and fabricated. A preferred design utilizes a thin film of ferroelectric polymer or copolymer directly deposited from solution onto a doped silicon transistor; this is in contrast to the epoxy adhered piezoelectric PVDF film utilized in the prior art. Elimination of the epoxy layer and reduction of the polymer film thickness effectively increases the piezoelectric film's capacitance and hence its available voltage signal. The intimate coupling of the polymer film to the transistor means also eliminates parasitic wiring capacitances and provides a low impedance signal which makes the sensor less noise susceptible.

The homopolymer PVDF, consisting of long chain molecules with the monomeric repeat unit $CF_2=CH_2$, and its copolymers with TRFE, which have their long chains made of random units of $CF_2=CH_2$ and $CF_2=CHF$, can be processed into oriented ferroelectric transducers having net macroscopic dipole moments. The polymers are semicrystalline and the crystalline component is responsible for their large polarizability. The PVDF films must generally be stretched mechanically as well as oriented electrically (poled) in order to convert the non-polar crystalline phase into the polar crystalline phase. Accordingly, this is the reason why current devices use preformed films in their design. The VDF-TRFE copolymers have the advantage of converting directly into the highly polar crystalline phase upon cooling from the melt to below the Curie (paraelectricferroelectric transition) temperature.

By solvent spin casting, films of P(VDF-TrFE) can be coated directly onto silicon transistors. Then the films can be optimally heat treated to improve crystallinity, dielectric strength, pyroelectric and piezoelectric response. Furthermore, the films can be electrically oriented (poled) in situ right on the silicon wafers. The poled films become piezoelectrically and pyroelectrically active and can be utilized in both the (ultrasonic or thermal) sensing mode or the (ultrasonic) actuator mode. In use and during processing subsequent to poling, the transducers must be kept below the composition dependent Curie temperature, $T_c = 70° C.-145° C$. The copolymers exhibit hysteresis in their behavior. The 70/30 molar ratio VDF/TRFE copolymer described herein has $T_c = 120°$ C. after poling. Note that before poling its $T_c \approx 100°$ C. upon heating from room temperature (ferroelectric to paraelectric transition) to the melt (150° C.) and that when cooling back down from the melt to room temperature, its $T_c \approx 65°$ C. (paraelectric to ferroelectric transition).

The ferroelectric sensor 100 of this invention, as described in FIG. 1, is preferably a combination of P(VDF-TrFE) film 10 and an n-channel MOSFET 15, although a p-channel MOSFET can also be used. The lower electrode 25 of the polymer layer 10 constitutes the gate electrode of the transistor 15. An important aspect of the design is that the metal contact to the MOS transistor gate is preferably extended. This configuration allows the receptive transducer area to be of arbitrary shape and size. Approximate and preferred specifications for the preferred sensor structure are listed below in TABLE I.

TABLE I

| | |
|---|---|
| Dielectric Constants: | $\epsilon$(Polymer) = 4–7$\epsilon_o$; 6$\epsilon_o$ preferred |
| Areas: | A(Gate) = 1.9 × $10^{-8}$ $m^2$ preferred, |
| | A(Extended Gate) = 1 × $10^{-11}$– 50 × $10^{-6}$ $m^2$; 7.8 × $10^{-6}$ $m^2$ preferred |
| Thicknesses: | t(Polymer) = 1–20 μm; 2.5 μm preferred, |
| | t(Extended Gate Oxide) = 0.2–2.0 μm; 1.0 μm preferred, |
| | t(Gate Oxide) = 0.015–0.15 μm; 0.08 μm preferred. |

Figure 2:
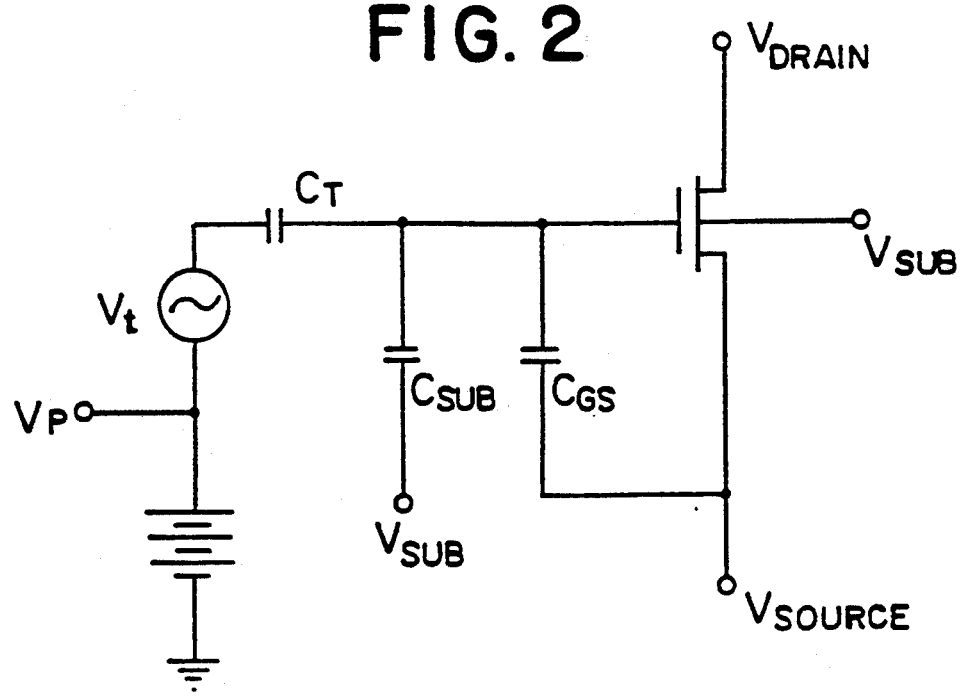
FIG. 2: is a preferred schematic model of the sensor structure of FIG. 1.

In one example of this invention, the extended gate area was (2.79 $mm^2$). The transistor gate width to length ratio (W/L) ratio can be made large, up to about 20,000 to 1, preferably 1900 μm/10 μm, to ensure good transconductance and to reduce noise. The equivalent circuit of this preferred sensor structure is shown in FIG. 2 wherein the sensing polymer is modeled as a voltage source $V_t$ and capacitor $C_T$ in series. As used in FIG. 2, $C_T$ = Polymer Capacitance, $C_{SUB}$ = Extended Gate Field Oxide Capacitance, $C_{GS}$ = Gate Oxide Capacitance, $V_P$ = External Applied Voltage (could be 0), $V_{sub}$=Substrate Potential, $V_{source}$=Source Potential, and $V_{drain}$=Drain Potential.

MOSFET transistors were fabricated for this example following a standard NMOS process flow manufacturing scheme. However, a CMOS process (complementary MOS) may be preferred in some instances. The steps included backside gettering of the silicon wafer 15, mask manufacturing, source and drain doping, field and gate oxide and polysilicon growth, e.g. oxide layer 30, and electrode deposition and pattern etching.

The current-voltage characteristics, threshold voltage, drain-gate diode breakdown voltage, and the oxide breakdown voltage were determined for this example. The threshold voltage was determined by tying the gate to drain, thus forcing the device to saturation and yielding a linear plot of $(I_D)^{\frac{1}{2}}$ vs $V_G$. The average threshold value was +0.18±0.02 v. If required, the threshold voltage can be adjusted by ion implantation. A sharp breakdown of the source and drain diodes occurred at 38±2 v. Breakdown voltage of the gate oxide was larger than 100 v.

A preferred method for the application of the polymer layer 10 to the semiconductor transistor means of this invention will now be described. Although it is expected that casting, sputtering, and other chemical or physical application procedures could produce an integral polymer layer, the preferred method employs spin coating. Powdered or pellet forms of PVDF, preferably 70/30 molar ratio P(VDF-TrFE)$_2$, are preferably dissolved in about 4ml of MEK (methyl ethyl ketone) solvent. The solution can be spin coated onto processed silicon wafers at about 2000–6000ORPM for about 20–60 seconds, preferably 4000 RPM for about 40 seconds. The data in Table II shows the dependence of the polymer film thickness vs. the solid content of the polymer in solution.

TABLE II

| Thickness Dependence on Solid Content of Solution | | | | |
|---|---|---|---|---|
| Solid Content Polymer (mg) pr 4 ml MEK | 350 | 375 | 375 | 400 |
| Number of Spin Coats | 1 | 1 | 3 | 3 |
| Thickness (μm) | 0.58 | 0.78 | 2.5 | 4.5 |

After spin coating to a thickness of preferably about 1–6 μm, the wafers are preferably put on a hot plate at about 80°–90° C. for about 10 minutes. They can then be heated at about 75°–120° C. for about 2–4 hours, preferably at about 100° C. inside a furnace for is about 3 hours, in order to evaporate substantially all of the MEK solvent. Subsequent spin coatings can be done in the same manner. After three layers are deposited, the films can be heat treated by first increasing their temperature to 170° C., holding there for one hour, and then cooling to room temperature. In order to improve the crystallinity of the film, a second heating can be carried out by heating the film to 128° C., a temperature between the Curie transition of about 100° C. and the melt temperature of about 150° C. The film is then preferably maintained at this temperature for about 1–2 hours and finally cooled to room temperature.

Different poling methods to activate the film have been employed in connection with this invention. A potential problem during the poling of these thin films is that the large voltage required to activate the films may cause breakdown. For this reason a corona discharge in air at elevated temperature was used to polarize P(VDF-TrFE) silicon-backed samples. This was done by applying several kV between a needle point and the lower grounded electrode (g=gate of transistor) of a 1.5 μm thick sample. The sample was heated at 90° C. for one hour and subsequently cooled to room temperature. This resulted in a film with a pyroelectric coefficient of 5.3 nC cm$^{-2}$K$^{-1}$. The piezoelectric response of the resultant ultrasonic transducer was verified in water at 10 MHz after a top electrode layer 20 was deposited and the pattern was defined. However, this thermal corona discharge often caused microfractures in thin copolymer layers, short circuiting the two electrodes 20 and 25. Although the copolymer is pyro- and piezoelectrically active, the transducer cannot be used due to the short.

In order to eliminate the potential of breakdown during poling, another corona poling method was investigated. In this case, 2.5 μm thick samples were corona poled at room temperature in air by using a controlling grid placed between the needle point and the sample. During poling the lower electrode (beneath the polymer film) was grounded while several kV and several hundred volts are put on the needle and grid, respectively. A charge builds up on the film's surface and hence creates a high field. This field aligns the dipoles in the copolymer. During the poling process, a current flows between the top and bottom electrodes 20 and 25, this current increases from zero to about 70 nA within about 10–20 sec.(corresponding to about 25 nA/,mm$^2$) upon switching the voltage between ground and needle. The current then decreases to a low value of about 11 nA or lower (about 3nA/mm$^2$). This current behavior is indicative of the poling process when a charge builds up on the surface and the dipoles align in the film. The residual current is due to a leakage through the film.

The upper electrode 20 of this invention preferably includes deposited metal. In the preferred embodiment 100, a layer of aluminum of about 100 nm was evaporated through a metal mask on top of each sample to serve as the top electrode. Other materials, such as gold or a combination of thin metallic films can be used and the top electrode 20 . The upper electrode 20 can additionally be protected by a thin layer 35, preferably etched 1μm parylene or the equivalent. When functioning as a sensor, this top electrode 20 will be grounded or connected to a voltage source, and the bottom electrode 25 (connected to the gate) will be left floating. After poling, the bottom and top electrodes 25 and 20 are shorted together for 24 hours to drain unstable charges from the polymer film. Then the relative pyroelectric activity of the poled polymer layer 10 was measured utilizing a black body radiation source, a chopped and a lock-in amplifier. Typical operating free of the chopper were 6–100 HZ.RMS values in the mV range which were obtained with the pyroelectric signal falling off as the frequency increased. The absolute pyroelectric activity was also measured by monitoring the temperature increase and charge output of the poled polymer film layer 10 when the transducer 100 was immersed in a heating bath. The value at 25° C. was 5 nC cm$^{-2}$K$^{-1}$.

A slightly different sequence for poling has been successfully applied to the sensor. After the heat treatment of the copolymer film, as described above, a metal electrode 20 is deposited through a metal mask, or is chemically or plasma etched. Next, the film can be poled in a similar fashion as described above.

Another successful poling method includes applying a high voltage, one or more kilovolts, between the two electrodes and across the copolymer film for an extended period of time(minutes to several hours). This can be done at an elevated temperature to speed up the poling process. The samples are slowly cooled down while maintaining the voltage over the electrodes.

To complete the preferred sensor structure, contact to the source and drain has to be made by removing the copolymer on top of the bonding pads. When plasma etching was used, it was found that the pyroelectric activity reduces by a factor of 10. The most probable cause of this reduction in activity is that the samples experienced a partial ferroelectric to paraelectric transition (depoling) due to heating during the plasma etching of the preferred copolymer film. This was eliminated by using a solvent etching method to remove the copolymer to contact the source and drain. However, plasma etching could still be used if the substrate was cooled during the etching process in order to prevent heating of the wafer above the Curie temperature.

Measurements were performed on the transistors with the poled polymer on its gate. When the I-V characteristics were measured by contacting the bottom electrode (gate of the transistor), the same values as on the original, unpoled transistors were obtained. This indicates that the poling process did not degrade the transistors.

From the foregoing, it can be understood that this invention provides improved ferroelectric sensors and methods for their manufacture. The ferroelectric sensors of this invention provide better acoustic imaging of body tissue with better acoustic impedance match to body tissues and water. These devices produce high voltage sensitivity and high electromechanical coupling coefficients and can be formed into arbitrary shapes. The disclosed transistor means provide an extremely high input impedance and low output impedance transformation at the sensor site and, hence, increase the signal to noise ratio of the device.

Although various embodiments have been illustrated, this was for the purpose of describing, and not limiting the invention. Various modifications, which will become apparent to one skilled in the art, are within the scope of this invention described in the attached claims.

We claim:

1. A method of manufacturing a ferroelectric polymer-containing sensor responsive at ultrasonic frequencies, comprising:
    (a) providing a semiconductor transistor having a gate with a first surface;
    (b) spin coating a solution comprising said polymer and a solvent onto said first surface to provide a solution coated surface;
    (c) removing substantially all of said solvent to provide a polymer film with a substantially uniform thickness of less than about 10 $\mu m$ coated on said first surface;
    (d) substantially uniformly poling at least a portion of said polymer film; and
    (e) providing at least one electrode electrically connected to said gate of said semiconductor transistor for establishing electrical contact between said polymer film and a voltage potential.

2. A method of claim 1 wherein said semiconductor transistor comprises a MOSFET having a gate electrode embedded therein for receiving an electrical signal from said polymer film.

3. The method of claim 2 wherein said polymer film comprises a copolymer comprising polyvinylidene fluoride and polytrifluoroethylene.

4. The method of claim 2 wherein said solution comprises a molar ration of polyvinylidene fluoride to polytrifluoroethylene in a range of about 60:40 to 85:15.

5. The method of claim 1 wherein said spin coating step (b) comprises a plurality of spin coating steps.

6. The method of claim 5 wherein said solution comprises about 200-500 mg of powdered P(VDF-TrFE) per 4 ml of solvent.

7. The method of claim 6 wherein said solvent comprises methyl ethyl ketone (MEK).

8. The method of claim 6 wherein said spin coating step (b) comprises spinning at about 2000-6000 RPM for about 20-60 seconds.

9. The method of claim 1 wherein said removing step (c) comprises heating said solution coated surface at about 75°-120° C. for about 2-4 hours.

10. The method of claim 5 wherein said plurality of spin coating steps are separated by heating steps.

11. The method of claim 1 further comprising heating said polymer film coated surface for a time sufficient to improve the crystallinity of said polymer film prior to said poling step (d).

12. The method of claim 11 wherein said poling step (d) comprises corona poling a crystalline component of said polymer film.

13. The method of claim 1 wherein said step of providing at least one electrode comprises evaporating a conductive layer on a top surface of said polymer film.

14. The method of claim 13 further comprising the step of providing a protective coating on said conductive layer.

15. The method of claim 14 comprising the further step of etching said protective coating.

* * * * *

UNITED STATES PATENT AND TRADEMARK OFFICE
CERTIFICATE OF CORRECTION

PATENT NO. : 5,254,504
DATED : October 19, 1993
INVENTOR(S) : Van der Spiegel et al.

It is certified that error appears in the above-identified patent and that said Letters Patent is hereby corrected as shown below:

In column 1, line 20, change "formed-into" to --formed into--.

In column 2, line 68, after "film" delete the ",".

In column 3, line 66, change "TRFE" to --TrFE--.

In column 4, line 9, change "TRFE" to --TrFE--.

In column 4, line 26, change "TRFE" to --TrFE--.

In column 5, line 1, change "$V_{sub}$Substrate" to --$V_{sub}$=Substrate--.

In column 5, line 31, change "2000-6000ORPM" to --2000-6000 RPM--.

In column 5, line 40, change "pr 4 ml MEK" to --per 4 ml MEK--.

In column 5, line 48, after "for", delete "is".

In column 6, line 28, after "25 nA/" delete ",".

UNITED STATES PATENT AND TRADEMARK OFFICE
CERTIFICATE OF CORRECTION

PATENT NO. : 5,254,504
DATED : October 19, 1993
INVENTOR(S) : Van der Spiegel, et. al.

It is certified that error appears in the above-indentified patent and that said Letters Patent is hereby corrected as shown below:

In column 6, line 52, after "operating", delete "free" and insert "frequencies".

Signed and Sealed this

Nineteenth Day of July, 1994

BRUCE LEHMAN

Attest:

Attesting Officer

Commissioner of Patents and Trademarks